(12) United States Patent
Ishii

(10) Patent No.: US 6,493,961 B2
(45) Date of Patent: Dec. 17, 2002

(54) PROCESSING UNIT FOR A SUBSTRATE

(75) Inventor: Katsumi Ishii, Fujino-machi (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 09/983,241

(22) Filed: Oct. 23, 2001

(65) Prior Publication Data

US 2002/0026728 A1 Mar. 7, 2002

Related U.S. Application Data

(60) Continuation of application No. 09/842,071, filed on Apr. 26, 2001, now Pat. No. 6,327,794, which is a division of application No. 09/321,542, filed on May 28, 1999, now Pat. No. 6,247,245.

(30) Foreign Application Priority Data

Nov. 18, 1998 (JP) ............................................. 10-327568

(51) Int. Cl.[7] .......................... F26B 21/06; B65G 21/02
(52) U.S. Cl. ................................ 34/82; 34/210; 34/217; 414/417; 414/416.08; 414/938; 414/940
(58) Field of Search .............................. 34/79, 82, 202, 34/210, 217; 414/416.08, 417, 937, 938, 939, 940; 432/239, 241, 244, 253

(56) References Cited

U.S. PATENT DOCUMENTS

| 4,770,590 A | 9/1988 | Hugues et al. ............... 414/172 |
| 5,234,528 A | 8/1993 | Nishi .......................... 156/345 |
| 5,261,935 A | 11/1993 | Ishii et al. ..................... 55/213 |
| 5,464,313 A | 11/1995 | Ohsawa ....................... 414/172 |
| 5,468,112 A | 11/1995 | Ishii et al. ................... 414/416 |
| 5,514,196 A | 5/1996 | Tanahashi et al. ............ 55/324 |
| 5,645,419 A | 7/1997 | Ohsawa et al. .............. 432/241 |
| 5,697,749 A | 12/1997 | Iwabuchi et al. ............ 414/217 |
| 5,820,366 A | 10/1998 | Lee ............................. 432/241 |
| 5,829,939 A | 11/1998 | Iwai et al. ................... 414/411 |
| 5,857,848 A | 1/1999 | Takahashi et al. ........... 432/253 |
| 5,961,323 A | 10/1999 | Lee ............................. 432/241 |
| 6,030,208 A | 2/2000 | Williams et al. ............. 432/253 |
| 6,092,980 A | 7/2000 | Kumasaka et al. .......... 414/804 |
| 6,095,806 A | 8/2000 | Suzuki et al. ................ 432/241 |
| 6,187,102 B1 | 2/2001 | Yamamoto ................... 118/725 |
| 6,204,194 B1 | 3/2001 | Takagi ......................... 438/758 |
| 6,231,290 B1 | 5/2001 | Kikuchi et al. .............. 414/221 |
| 6,318,944 B1 * | 11/2001 | Shimeno et al. ............. 414/172 |
| 6,375,403 B1 * | 4/2002 | Mages et al. ................ 414/411 |
| 6,390,753 B1 * | 5/2002 | De Ridder ................... 414/160 |

* cited by examiner

Primary Examiner—Pamela Wilson
(74) Attorney, Agent, or Firm—Smith, Gambrell & Russell, LLP

(57) ABSTRACT

A processing unit for a substrate has a vertical thermal processing furnace 4 having a bottom and an opening 4a provided at the bottom. A boat 3 holding substrates W in vertical multistairs can be placed on a first lid 17, and the first lid 17 can open and close the opening 4a of the vertical thermal processing furnace 4 with the boat 3 placed thereon. The processing unit also has a boat-placing portion 19 on which the boat 3 and another boat 3 can be placed and a boat conveying mechanism 21 for conveying the two boats 3 alternatively between the boat-placing portion 19 and the first lid 17. A second lid 18 hermetically closes the opening 4a of the vertical thermal processing furnace 4 when the first lid 17 opens the opening 4a but no boat 3 passes through the opening 4a. The processing unit can effectively reduce the undesirable influence from the opening 4a when the first lid 17 is taken off from the opening 4a and the boat 3 is conveyed out, and can also reduce the wasted energy by preventing the fall of the temperature in the interior of the thermal processing furnace 4.

18 Claims, 8 Drawing Sheets

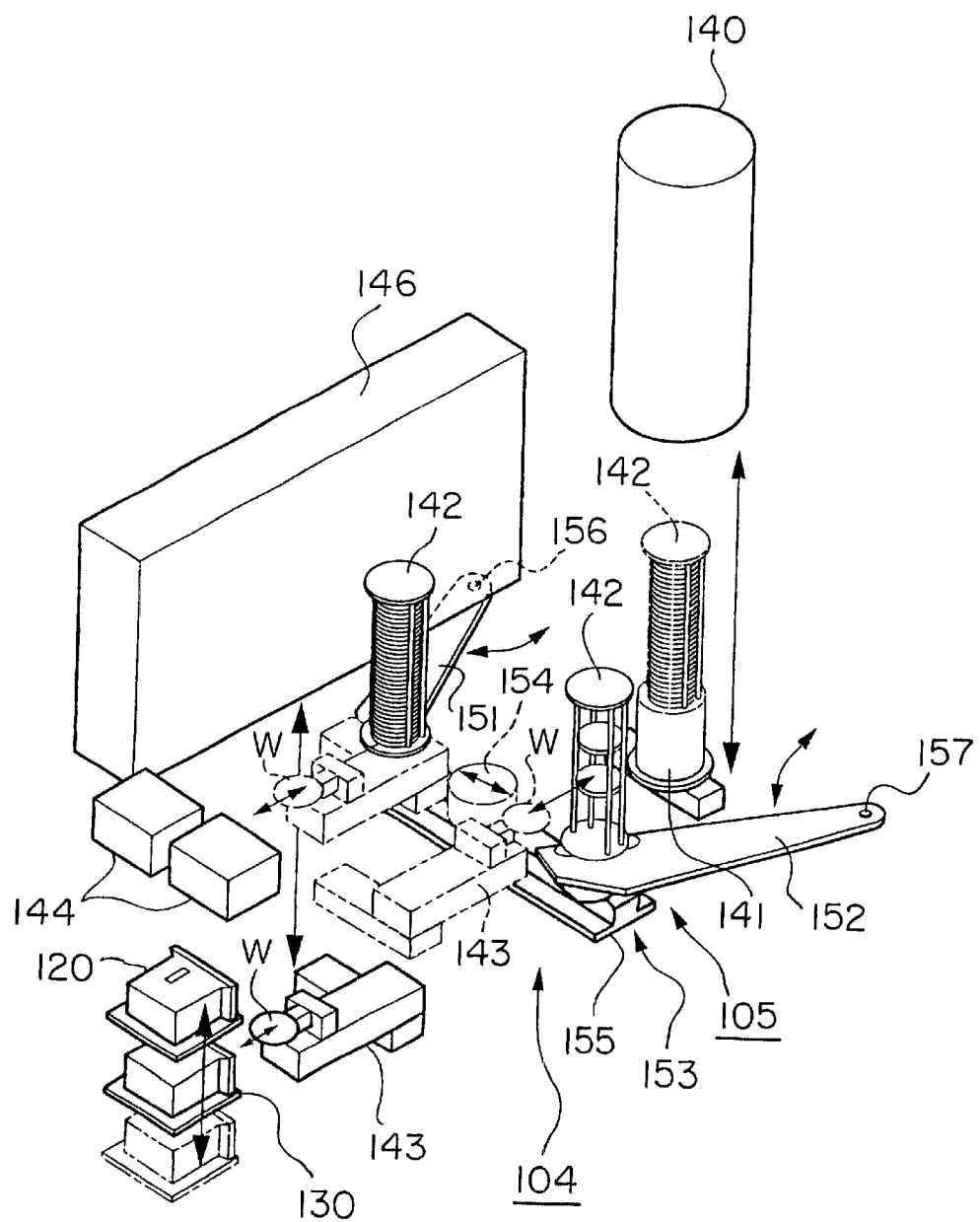
F I G. 7

PROCESSING UNIT FOR A SUBSTRATE

CROSS-REFERENCE TO RELATED APPLICATION

This application is a continuation of application Ser. No. 09/842,071, filed Apr. 26, 2001; now U.S. Pat. No. 6,327,794 which is a division of application Ser. No. 09/321,542 filed May 28, 1999, now U.S. Pat. No. 6,247,245 which is incorporated herein, in its entirety, by reference.

BACKGROUND OF THE INVENTION

1. Field of the Invention

This invention relates to a processing unit for a substrate and a processing method for a substrate.

2. Disclosure of the prior art

Processes for manufacturing semiconductor devices include steps in which semiconductors as substrates undergo processes such as oxidation, diffusion, CVD (Chemical Vapor Deposition) or the like. Vertical thermal processing units are often used for conducting the various processes. A conventional vertical thermal processing unit comprises: a carrier-transferring area where an operator or an automatic conveying mechanism holds and conveys a carrier housing semiconductor wafers, and a loading area where semiconductor wafers in the carrier are transferred to a boat as a holder for a thermal processing which is then loaded into or unloaded from a thermal processing furnace.

In such vertical thermal processing units, it is preferable for a partition (bulkhead) to be provided between the carrier-transferring area which is exposed to the atmosphere and the loading area. The partition allows the loading area to remain clean and prevents a natural oxidation film from forming on the semiconductor wafers. The loading area should also be preferably filled with an inert gas such as nitrogen. A closed-type carrier, whose entrance for semiconductor wafers can be hermetically closed by a lid, should also be preferably used in the vertical thermal processing unit in order to prevent the semiconductor wafers from being contaminated with particles.

A carrier-placing portion having an opening is arranged at the partition between the carrier-transferring area and the loading area. The opening is adapted to become in contact with the carrier on the side of the carrier-transferring area. A door is provided at the opening on the side of the loading area to open and close it. When processing the semiconductor wafers, the lid of the carrier is aligned to be in contact with the carrier-placing portion, and the door and the lid are opened to communicate the interior of the carrier with the loading area. The semiconductor wafers are then conveyed from the interior of the carrier to the boat in the loading area via the opening. The boat is then loaded in the thermal processing furnace to perform the prescribed processes on the semiconductor wafers.

Furthermore, two boats are used as below. One boat of them is placed on the lid which can be vertically elevated to open and close the opening of the thermal processing furnace. The boat is conveyed into the thermal processing furnace. While the opening of the furnace is hermetically closed with the lid and the semiconductor wafers in the boat undergo the thermal processing, other the semiconductor wafers are transferred to the other boat. This improves the throughput of the vertical thermal processing unit.

Vertical thermal processing units for semiconductor wafers having large, for example 300 mm diameters need thermal processing furnaces having large capacities and large openings. Thus, after the thermal processing, considerable heat in the furnace may leak from the opening of the furnace into the loading area while the opening of the furnace is opened, the boat in the furnace is conveyed out, the next boat is conveyed into the furnace and the opening of the furnace is closed with the lid. This may raise the temperature of the loading area and influence instruments in the loading area. In addition, the wasted energy may be so much because the interior of the thermal processing furnace has to be maintained above the predetermined temperature.

The width, the depth and the height of the vertical thermal processing unit are increased accompanying the increase of the diameter of the semiconductor wafer, for example to 300 mm. The space of the floor and the height of the ceiling are also increased for arranging the vertical thermal processing unit. These lead to the increase of the costs for manufacturing and maintaining of the vertical thermal processing unit. Therefore, there is a requirement that the vertical thermal processing unit be miniaturized as much as possible.

In order to improve the ability to process the semiconductor wafers with the vertical thermal processing unit, it is desirable that the boat-placing portion is disposed in the loading area for placing one boat to which semiconductor wafers are transferred while the thermal processing is conducted to the other boat, that the transferring mechanism is disposed in the loading area for transferring the semiconductor wafers between the boat on the boat-placing portion and the carrier at the carrier-placing portion and that the boat-conveying mechanism is disposed in the loading area for conveying the boat between the boat-placing portion and the lid. Having the trace of the boat and the occupying space of the conveying mechanism overlap is effective in miniaturizing the vertical thermal processing unit. However, in that case, there is an undesirable possibility that the boat and the transferring mechanism interference with each other.

In addition, the boat before the thermal processing may be under the lee of the other boat after the thermal processing while the two boats are conveyed between the boat-placing portion and the lid respectively. In that case, the semiconductor wafers in the boat before the thermal processing may be contaminated with particles or gases coming from the other boat after the thermal processing.

SUMMARY OF THE INVENTION

Therefore, the object of this invention is to provide a vertical thermal processing unit, which can reduce the undesirable influence caused by the heat leaking from the opening of the furnaces when the lid is taken off from the opening and the boat after the thermal processing is conveyed out.

Another object of this invention is to improve the ability to process the substrates, by making the trace of the boat and the occupying space of the transferring mechanism of the substrates overlap and by laterally evacuating the transferring mechanism from the trace of the boat when the boat is conveyed, in order to prevent the interference of the boat and the transferring mechanism.

Another object of this invention is to achieve the miniaturization of the unit by arranging a notch aligning mechanism along a vertical central line of the carrier-placing portion and by reducing the width and the depth thereof without increasing the height thereof.

Another object of this invention is to provide a boat conveying method where the contamination of the substrates is restricted when the boat is conveyed.

To achieve the above objects, this invention is characterized by a feature wherein a processing unit for a substrate comprises: a vertical thermal processing furnace having a bottom and an opening provided at the bottom, a first lid on which a boat holding substrates in vertical multistairs can be placed and which can open and close the opening of the vertical thermal processing furnace with the boat placed thereon, a boat-placing portion on which the boat and another boat can be placed, a boat conveying mechanism for conveying the two boats alternatively between the boat-placing portion and the first lid, and a second lid for hermetically closing the opening of the vertical thermal processing furnace when the first lid opens the opening but no boat passes through the opening.

According to the feature, the processing unit can effectively reduce the undesirable influence from the opening when the first lid is taken off from the opening and the boat is conveyed out, and can also reduce the wasted energy by preventing the fall of the temperature in the interior of the thermal processing furnace.

Preferably, the second lid is a shutter which can be moved vertically and horizontally with respect to an outside surface of the opening of the vertical thermal processing furnace to open and close the opening.

Preferably, the processing unit further comprises: a carrier-placing portion on which a carrier housing the substrates can be placed, and a transferring mechanism for transferring the substrates between the carrier placed on the carrier-placing portion and the boat placed on the boat-placing portion. In that case, the transference mechanism is preferably retractable in such a manner that the transferring mechanism does not interfere with the boat when the boat is conveyed by the boat conveying mechanism. In that case, the processing unit can be suitably miniaturized.

Preferably, a notch aligning mechanism is arranged along a vertical central line of the carrier-placing portion for aligning notches provided at the substrates. In that case, the width, the depth and the height of the processing unit can be effectively reduced, so that the time for transferring the substrates can be substantially reduced.

Preferably, the boat conveying mechanism includes; a first arm which has a rotational axis and a distal end and which can be vertically elevated and horizontally rotated around the rotational axis, and a second arm which is supported at the distal end in such a manner that the second arm can horizontally rotate around the distal end and which can vertically hold the boat and convey the boat in such a manner that a center of the boat passes over the rotational axis of the first arm, and the boat conveying mechanism can convey the boat in a radial direction with respect to the rotational axis of the first arm by synchronously rotating the first arm and the second arm. In that case, the space for conveying the boat can be minimized, so that the width and the depth of the processing unit can be substantially reduced.

Preferably, the transferring mechanism is movable vertically above the boat conveying mechanism.

Preferably, a ventilating unit is disposed adjacent the boat-placing portion for making a clean gas flow. In that case, the boat-placing portion has preferably a first placing portion and a second placing portion arranged between the first placing portion and the first lid, and the boat conveying mechanism is also preferably operable to convey the boat from the first placing portion to the second placing portion, from the second placing portion to the first lid, and from the first lid to the first placing portion in such a manner that the boat passes under lee of the second placing portion with respect to the clean gas flow made by the ventilating unit.

In addition, this invention is characterized by a feature wherein a processing method for a substrate by using a processing unit for the substrate comprising: a vertical thermal processing furnace having a bottom and an opening provided at the bottom, a first lid on which a boat holding substrates in vertical multistairs can be placed and which can open and close the opening of the vertical thermal processing furnace with the boat placed thereon, a boat-placing portion having a first placing portion and a second placing portion arranged between the first placing portion and the first lid, a second lid for hermetically closing the opening of the vertical thermal processing furnace when the first lid opens the opening but no boat passes through the opening, a carrier-placing portion on which a carrier housing the substrates can be placed, a transferring mechanism for transferring the substrates between the carrier placed on the carrier-placing portion and the boat placed on the boat-placing portion, a ventilating unit disposed adjacent the boat-placing portion for making a clean gas flow, and a boat conveying mechanism for conveying the boat from the first placing portion to the second placing portion, from the second placing portion to the first lid, and from the first lid to the first placing portion in such a manner that the boat passes under lee of the second placing portion with respect to the clean gas flow made by the ventilating unit, said method comprises the steps of: conveying a first boat from the first portion to the second portion by the boat conveying mechanism, conveying a second boat from the first lid to the first portion by the boat conveying mechanism in such a manner that the second boat passes under the lee of the second placing portion with respect to the clean gas flow made by the ventilating unit, and conveying the first boat from the second portion to the first lid by the boat conveying mechanism.

According to the feature, the contamination of the substrates in the boat before the thermal processing is prevented when the boat is conveyed because the boat does not pass under the lee of the other boat after the thermal processing.

BRIEF DESCRIPTION OF THE DRAWINGS

FIG. 7 is a schematic perspective view of another embodiment of the vertical thermal processing unit of the invention;

DESCRIPTION OF THE PREFERRED EMBODIMENT

Embodiments of the invention will now be described in more detail with reference to FIGS. 1 to 10.

Figure 1:
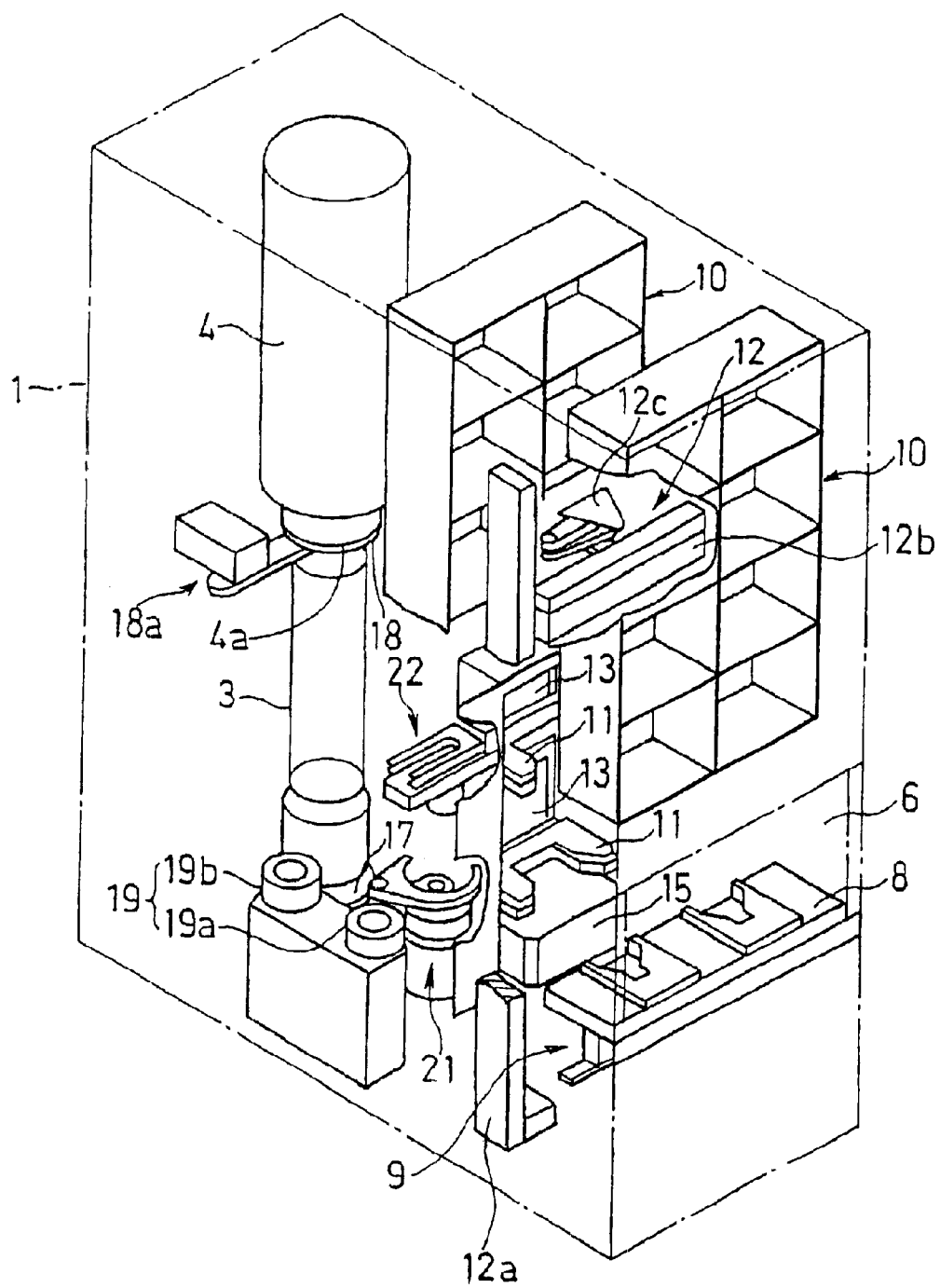
FIG. 1 is a schematic perspective view of an embodiment of the vertical thermal processing unit of the invention.
Figure 2:
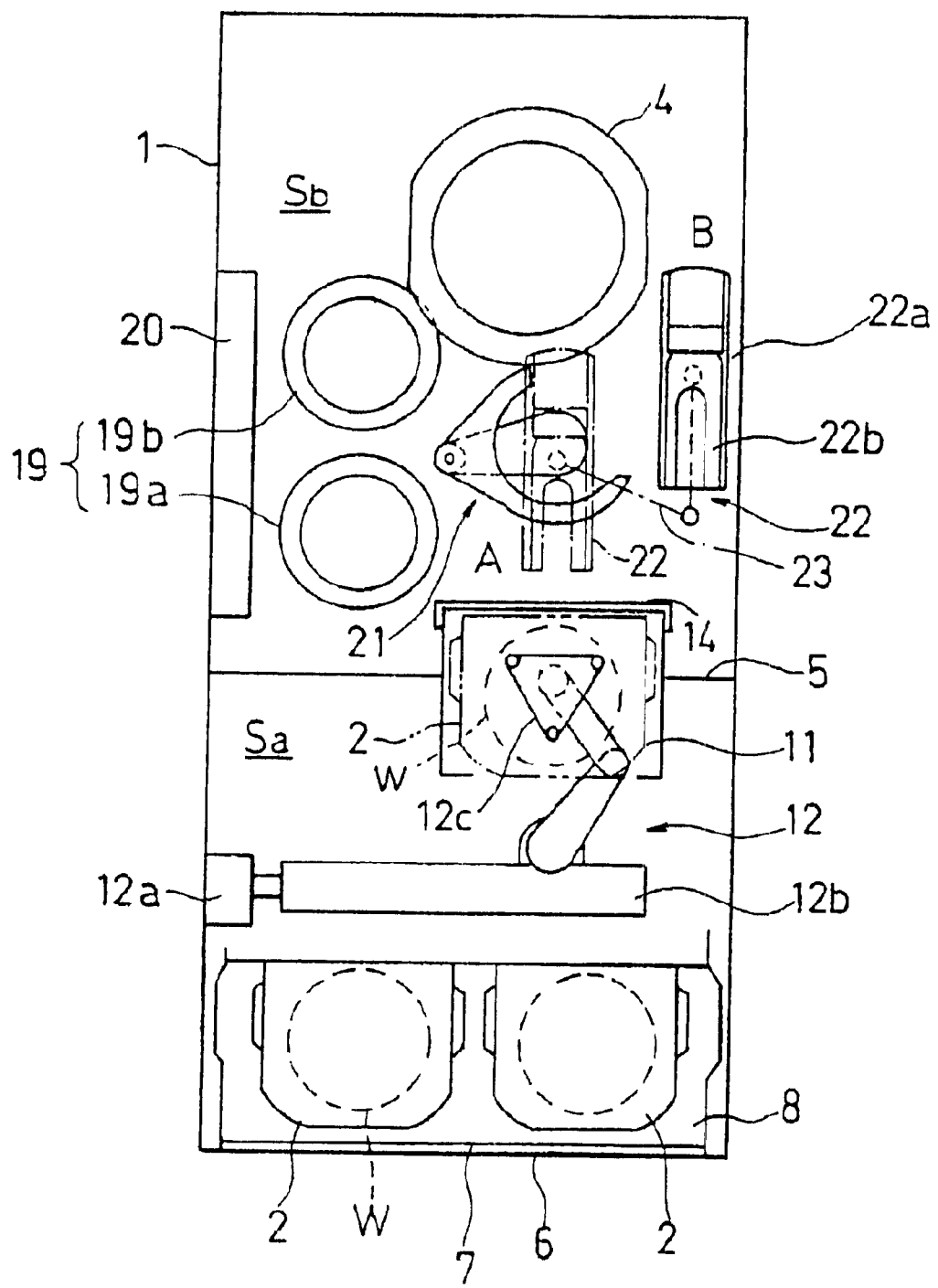
FIG. 2 is a schematic plan view of the vertical thermal processing unit in FIG. 1.
Figure 3:
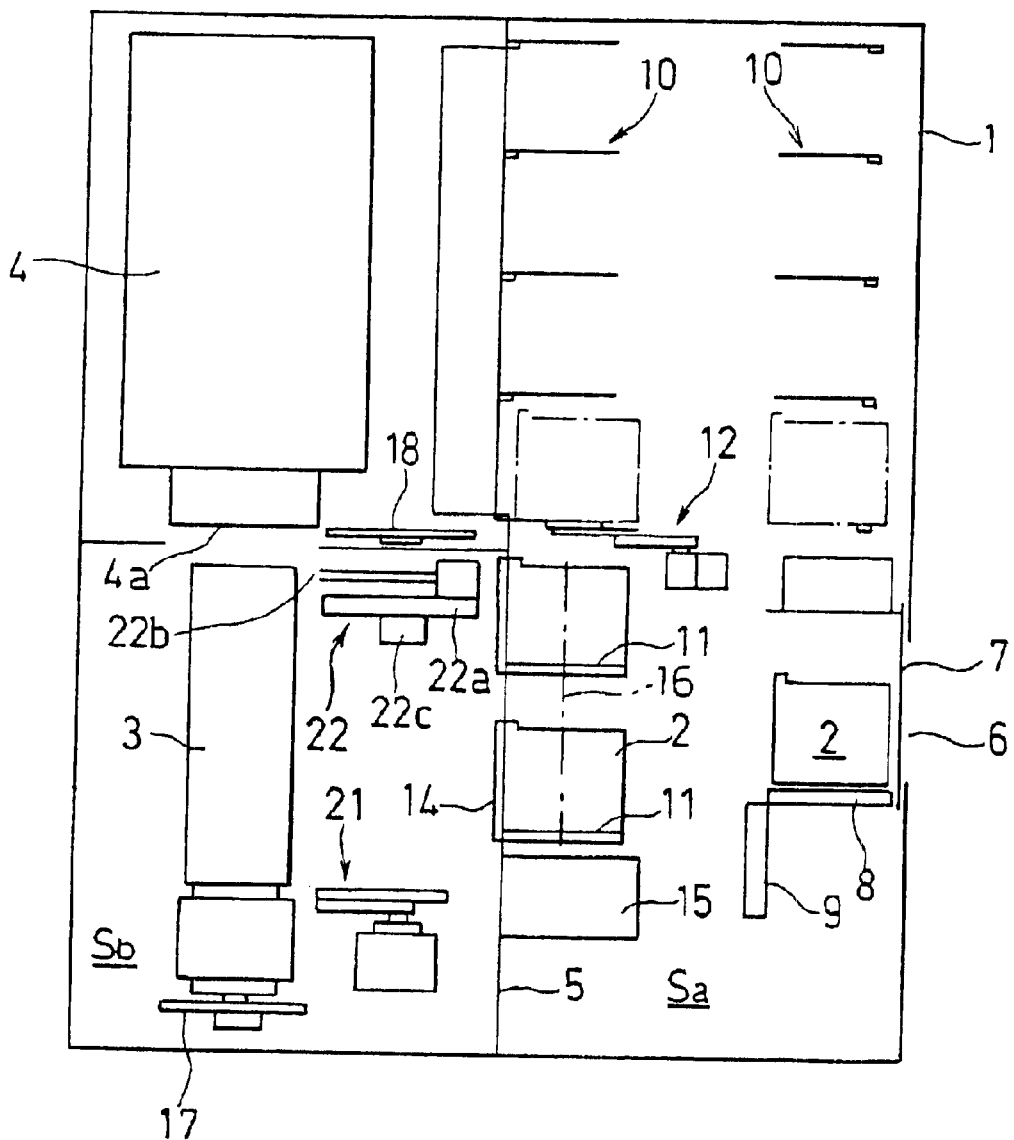
FIG. 3 is a schematic vertical sectional view of the vertical thermal processing unit in FIG. 1.
Figure 4:
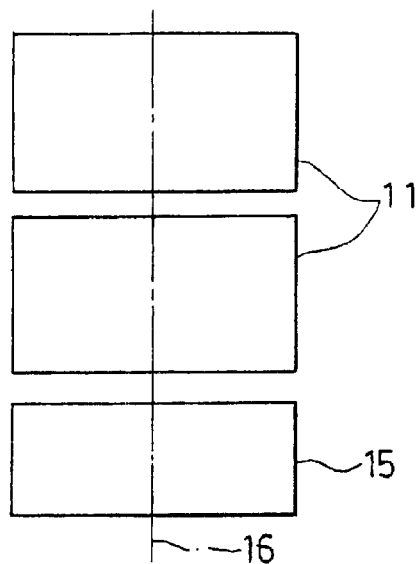
FIG. 4 is a schematic front view of the carrier-placing portion and the notch aligning mechanism in FIG. 1.
Figure 5:
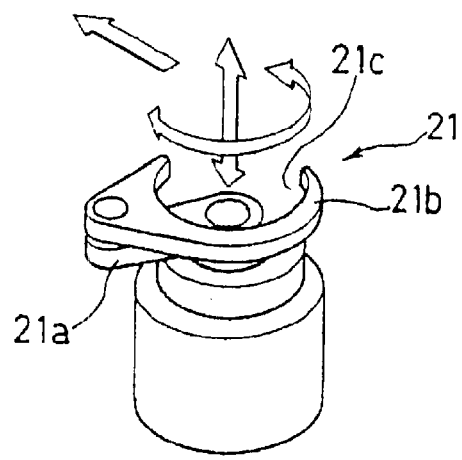
FIG. 5 is a schematic perspective view of the boat conveying mechanism in FIG. 1.
Figure 6:
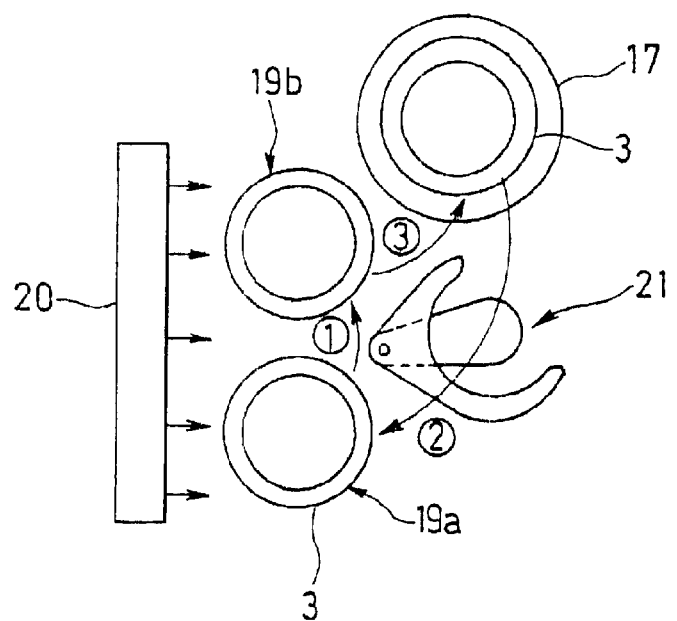
FIG. 6 is a schematic plan view showing a way for conveying the boats.

FIG. 1 schematically shows an embodiment of the vertical thermal processing unit of the invention. FIG. 2 is a schematic plan view of the vertical thermal processing unit in FIG. 1. FIG. 3 schematically shows a vertical section of the vertical thermal processing unit in FIG. 1. FIG. 4 is a schematic front view of the carrier-placing portion and the notch aligning mechanism in FIG. 1. FIG. 5 is a schematic perspective view of the boat conveying mechanism in FIG. 1. FIG. 6 is a schematic plan view showing a way for conveying the boats.

In these FIGS., a numeral sign 1 designates a housing forming outside walls of the vertical thermal processing unit disposed in a clean room. The interior of the housing 1 is divided by a partition (bulkhead) 5 into a carrier-transferring area Sa into and from which carriers 2 are conveyed and in which the carries 2 are kept, and a loading area Sb where semiconductor wafers W (substrates to be processed) in the carriers 2 are transferred to boats 3 which are loaded into or unloaded from a vertical type thermal processing furnace 4.

As shown in FIGS. 1 and 2, an entrance 6 is provided in front of the housing 1 for introducing and discharging the carriers 2 by an operator or an automatic conveying robot. As shown in FIGS. 2 and 3, the entrance 6 is provided with a door 7 which can move vertically to open and close the entrance 6. A stage 8 is provided near the entrance 6 in the carrier-transferring area Sa for placing the carrier 2 thereon. As shown in FIGS. 1 and 3, a sensor mechanism 9 is provided at the rear portion of the stage 8 for opening a lid (not shown) of the carrier 2 and detecting positions of and the number of the semiconductor wafers W. As shown in FIGS. 1 to 3, shelf-like storing sections 10 are formed above the stage 8 and near the upper portion of the partition 5 for storing a plurality of the carriers 2.

As shown in FIG. 3, plural, for example two carrier-placing portions (transfer stages) 11 are provided in vertically spaced positions on the side of the partition 5 as tables for placing the carriers 2 thereon for transferring the semiconductor wafers. Thus, the throughput of the processing unit can be improved as one carrier 2 can be exchanged at one carrier-placing portion while the semiconductor wafers W are transferred to another carrier 2 at the other carrier-placing portion. A carrier transference mechanism 12 is arranged in the carrier-transferring area Sa for transferring the carriers 2 to and from the stage 8, the storing sections 10 and the carrier placing portions 11.

As shown in FIG. 2, the carrier transference mechanism 12 comprises: an elevating arm 12b which can be moved vertically by an elevating mechanism 12a provided on a side of the carrier-transferring area Sa, and a transferring arm 12c mounted on the elevating arm 12b for supporting the bottom of the carrier 2 to horizontally transfer the carrier 2.

The carrier 2 is a so-called closed type, which can house a number of, for example 13 or 25 semiconductor wafers W and which can be hermetically closed by the lid (not shown). The carrier 2 comprises a portable plastic container for housing and holding semiconductor wafers W in multistairs in horizontal attitude and in vertically spaced relation by a prescribed pitch. The diameter of the semiconductor wafer W is for example 300 mm. The lid (not shown) is removably attached at the wafer-entrance formed in front of the carrier 2 in such a manner that the lid can sealingly close the wafer-entrance.

A clean atmospheric air, which has passed through filters (not shown), is supplied into the carrier-transferring area Sa, so that the carrier-transferring area Sa is filled with the clean atmospheric air. On the other hand, a clean atmospheric air is also supplied into the loading area Sb, so that the loading area Sb is filled with the clean atmospheric air, or an inert gas such as nitrogen ($N_2$) is supplied into the loading area S2, so that the loading area Sb is filled with the inert gas. As shown in FIG. 1, the partition 5 has two, upper and lower openings 13, with each of which the carrier 2 is adapted to come into contact on the side of the carrier-transferring area Sa. The openings 13 match with the carrier-placing portions 11 respectively. Each opening 13 is provided with a lid 14 for opening and closing the opening 13. The opening 13 is formed in such a manner that the size of the opening 13 is substantially the same as that of the wafer-entrance of the carrier 2, so that semiconductor wafers W can be transferred into and from the carrier 2 through the opening 13 and the wafer-entrance.

Each door 14 is provided with a lid opening-closing mechanism (not shown) for opening and closing the lid of the carrier 2. Each door 14 is also connected with a door opening-closing mechanism (not shown) for opening and closing the door 14 on the side of the loading area Sb. The door opening-closing mechanism is adapted to move the door 14 and the lid toward the side of the loading area Sb and further move (evacuate) them upward or downward not to disturb the transference of the semiconductor wafers W. As shown in FIG. 3, a notch aligning mechanism 15 is arranged below the carrier-placing portions 11 and along a vertical central line of the carrier-placing portion 11 for aligning notches (cut portions) provided at peripheries of the semiconductor wafers W i.e. for aligning the crystalline directions of the semiconductor wafers W. The notch aligning mechanism 15 has an opening on the side of the loading area Sa. The notch aligning mechanism 15 is adapted to align the notches of the semiconductor wafers W transferred from the carrier 2 on the carrier-placing portion 11 by the transferring mechanism 22.

The notch aligning mechanism 15 has two apparatus in vertically spaced positions, each apparatus of which can align the two notches of the two semiconductor wafers W. Thus, the throughput of the processing unit can be improved as one apparatus can transfer back the aligned semiconductor wafers W to the boat 3 while the other apparatus aligns other semiconductor wafers W. The apparatus may be adapted to align plural, for example 3 or 5 semiconductor wafers W at a time. The central line of the semiconductor wafer W being aligned by the notch aligning mechanism 15 is adapted to coincide with the central line 16 of the semiconductor wafer W in the carrier 2 placed on the carrier-placing portion 11. Thus, the width, the depth and the height of the processing unit can be effectively reduced, so that the time for transferring the semiconductor wafers can be substantially reduced.

The thermal processing furnace 4 is disposed in a rear and upper portion in the loading area Sb. The thermal processing furnace 4 has a furnace opening 4a in the bottom thereof. A lid 17 is provided below the furnace 4. The lid 17 is adapted to be vertically moved by an elevating mechanism (not shown) for loading a boat 3 into and unloading it from the furnace 4 and for opening and closing the furnace opening 4a. The boat 3, which can hold a large number of, for example 100 or 150 semiconductor wafers W in vertical equally spaced multistairs, is adapted to be placed on the lid 17. The boat 3 is made of crystal or the like. The thermal processing furnace 4 is provided with a shutter 18 at the furnace opening 4a for closing the furnace opening 4a while the lid 17 is taken off and the boat 3 is unloaded after the thermal processing. The shutter 18 is adapted to horizontally pivot to open and close the furnace opening 4a. A shutter driving mechanism 18a is provided to make the shutter 18 pivot.

As shown in FIG. 2, a boat-placing portion (boat stage) 19 is disposed adjacently in a side region of the loading area Sb for placing the boat 3 thereon when transferring semiconductor wafers W into and from the boat 3. The boat-placing portion 19 has a first placing portion 19a and a second placing portion 19b arranged between the first placing portion 19a and the first lid 17. A ventilating unit 20 is disposed adjacent the boat-placing portion 19 for cleaning the circulation gas (the clean atmospheric air or the inert gas) in the loading area Sb via filters and making a clean gas flow therefrom.

A boat-conveying mechanism 21 is arranged between the carrier-placing portion 11 and the thermal processing furnace 4 in the lower portion in the loading area Sb for conveying the boat 3 between the boat-placing portions 19 and the lid 17. Specifically, the boat-conveying mechanism 21 is arranged for conveying the boat 3 between the first placing portion 19a or the second placing portion 19b and the lowered lid 17, and between the first placing portion 19a and the second placing portion 19b.

A transferring mechanism 22 is arranged above the boat-conveying mechanism 21 for transferring semiconductor wafers W between the carrier 2 on the carrier-placing portion 11 and the boat 3 on the boat-placing portion 19, specifically between the carrier 2 on the carrier-placing portion 11 and the notch aligning mechanism 15, between the notch aligning mechanism 15 and the boat 3 on the first placing portion 19a of the boat-placing portion 19, and between the boat 3 after the thermal processing on the first placing portion 19a and the vacant carrier 2 on the carrier-placing portion 11.

As shown in FIG. 2, the boat conveying mechanism 21 has an arm which can support one boat 3 vertically and move (expands and contracts) horizontally. Specifically, as shown in FIG. 5, the boat conveying mechanism 21 has a first arm 21a which has a rotational axis and a distal end and which can be elevated and horizontally rotated around the rotational axis. The boat conveying mechanism 21 also has a C-shaped support arm 21b which is supported at the distal end of the first arm 21a in such a manner that the support arm 21b can horizontally rotate around the distal end. The C-shaped support arm 21b forms an opening portion 21c whose center is designed to pass the rotational axis of the first arm 21a and which holds the boat 3 vertically. That is, a center of the boat can pass over the rotational axis of the first arm 21a. Thus, the boat 3 can be conveyed in a radial direction (a horizontal linear direction) with respect to the rotational axis of the first arm 21a by synchronously rotating the first arm 21a and the support arm 21b. Therefore, the area for conveying the boat 3 can be minimized as much as possible, so that the width and the depth of the processing unit can be reduced.

The boat conveying mechanism 21 can move as shown by arrows in FIG. 5. The boat conveying mechanism 21 conveys the boat 3 as shown by arrows in FIG. 6. Specifically, the boat conveying mechanism 21 conveys one boat 3 before the thermal processing waiting on the first placing portion 19a to the second placing portion 19b (①). Then the boat conveying mechanism 21 conveys the other boat 3 after the thermal processing from the first lid 17 to the first placing portion 19a (②). Then, the boat conveying mechanism 21 conveys the boat 3 before the thermal processing on the second placing portion 19b onto the lid 17 (③). As shown in FIG. 6, the boat 3 after the thermal processing can pass under the second placing portion 19b with respect to the clean gas flow made by the ventilating unit 20. Thus, the boat 3 before the thermal processing never passes under the other boat 3 after the thermal processing. Therefore, the semiconductor wafers W in the boat 3 before the thermal processing are prevented from being contaminated by particles or gases coming from the boat 3 after the thermal processing when the boats 3 are conveyed.

As shown in FIG. 2, a transferring mechanism 22 has a base stage 22a which can horizontally rotate around a rotational axis and a support arm 22b provided on the base stage 22a which can move forward and backward and which has plural, for example 2 or 5 thin fork-like plates for supporting semiconductor wafers.

The transferring mechanism 22 can laterally retract (evacuate) from the operating position A shown as an imaginary line in FIG. 2 into the evacuating position B shown as a real line in the same figure by means of a pivoting arm 23. A proximal end portion of the pivoting arm 23 is connected with an elevating mechanism (not shown) provided in the other side region of the loading area Sb. Thus, the transferring mechanism 22 can move vertically. A lower protrusion 22c of the base stage 22a can be accommodated in the opening portion 21c of the support arm 21b of the boat conveying mechanism 21 being in a lowered waiting state when the transferring mechanism 22 is lowered at the lowest position. Thus, the interference of the transferring mechanism 22 with the boat conveying mechanism 21 is prevented, and the elevating stroke of the transferring mechanism 22 is set in the smaller area.

Next, the operation of the described vertical thermal processing unit is explained as below. The conveying method of the boat is also explained together. When a carrier 2 is placed on the stage 8 through the entrance 6, the sensor mechanism 9 detects the placing state of the carrier 2. Then, the lid of the carrier 2 is opened, and the sensor mechanism 9 detects positions of and the number of the semiconductor wafers W in the carrier 2. Then, the lid of the carrier 2 is closed again, and the carrier 2 is conveyed into the keeping portions 10 by means of the carrier transference mechanism 12.

Then, a carrier 2 stored in the keeping portion 10 is conveyed onto the carrier-placing portion 11 at a suitable time by means of the carrier transference mechanism 12. After the lid of the carrier 2 on the carrier-placing portion 11 and the door 14 of the opening 13 of the partition 5 are opened, the transferring mechanism 22 takes out semiconductor wafers W from the carrier 2. Then, the transferring mechanism 22 transfers them successively into a vacant boat 3 placed on the first placing portion 19a of the boat-placing portion 19 via the notch aligning mechanism 15. While the semiconductor wafers W are transferred, the boat conveying mechanism 21 is lowered to evacuate from the transferring mechanism 22, so that the interference of the boat conveying mechanism 21 and the transferring mechanism 22 is prevented. As the notch aligning mechanism 15 is arranged on the central line 16 of the carrier-placing portion 11, the width of the vertical thermal processing unit can be reduced, so that the processing unit can be miniaturized. In addition, the time for transferring the semiconductor wafers can be reduced, so that the throughput of the processing unit can be substantially improved.

After the transference of the semiconductor wafers W is completed, the transferring mechanism 22 laterally retracts (evacuates) from the operating position A into the evacuating position B in the other side region of the housing 1 by means of the pivoting arm 23.

After the thermal processing is completed, the lid 17 is lowered, and the boat 3 after the thermal processing is conveyed out from the furnace 4 into the loading area Sb. The shutter 18 hermetically closes the opening 4a of the furnace immediately after the lid 17 is taken off with the boat 3. Thus, only little heat leaks from the opening 4a of the furnace 4 into the loading area Sb, so that the heat seldom influence the instruments in the loading area Sb. After the boat 3 after the thermal processing is conveyed out from the furnace 4, as shown in FIG. 6, the boat conveying mechanism 21 conveys another boat 3 before the thermal processing waiting on the first placing portion 19a to the second placing portion 19b (①). Then the boat conveying mechanism 21 conveys the boat 3 after the thermal processing from the first lid 17 to the first placing portion 19a (②). Then, the boat conveying mechanism 21 conveys the boat 3 before the thermal processing placed on the second placing portion 19b onto the lid 17 (③). That is, the boat conveying mechanism 21 conveys the boats in such a manner that the boat 3 before the thermal processing never passes under lee of the other boat 3 after the thermal processing. Therefore, the semiconductor wafers W in the boat 3 before the thermal processing are prevented from being contaminated by particles or gases coming from the boat 3 after the thermal processing when the boats 3 are conveyed. The boat 3 before the thermal processing is relatively further away from the other boat 3 after the thermal processing immediately after the latter is conveyed out from the furnace. Thus, the influence from the boat 3 after the thermal processing to the other boat 3 before the thermal processing is effectively restrained or prevented.

The boats 3 being conveyed and the transferring mechanism 22 are effectively prevented from interfering with each other because the latter evacuates not upward but laterally from the boat conveying mechanism 21. The shutter 18 which horizontally pivots to open and close and the transferring mechanism 22 are also prevented from interfering with each other because the latter evacuates not upward but laterally.

After the boat 3 before the thermal processing is conveyed onto the lid 17, the boat 3 and the lid 17 are introduced into the furnace 4 through the opening 4a where the shutter 18 is opened. The next thermal processing is conducted on the semiconductor wafers W in the boat 3. On the other hand, after the boat 3 after the thermal processing is conveyed onto the first placing portion 19a, the processed semiconductor wafers W in the boat 3 are transferred back from the boat 3 into the vacant carrier 2 on the carrier-placing portion 11 by means of the transferring mechanism 22. Then, the above cycle is repeated.

Another embodiment of the invention will now be described in more detail with reference to FIGS. 7 to 10. FIG. 7 is a schematic perspective view of another embodiment of the vertical thermal processing unit of the invention. The exterior portion and the inside walls of the processing unit are not shown in FIG. 7 for convenience of the illustration. A boat conveying mechanism 105 comprises: a first pivoting arm 151 for conveying a wafer-boat 142 from a first placing portion onto a boat-elevator 141, a second pivoting arm 152 for conveying the wafer-boat 142 from the boat-elevator 141 onto a second placing portion, and a boat-moving mechanism 153 for conveying the wafer-boat 142 from the second placing portion onto the first placing portion.

The boat-moving mechanism 153 comprises: a boat-stage 154 on which the wafer-boat 142 is placed, a guide rail 155 for guiding the boat-stage 154 between the first placing portion and the second placing portion, and driving means (not shown) for driving the boat-stage 154.

Figure 9:
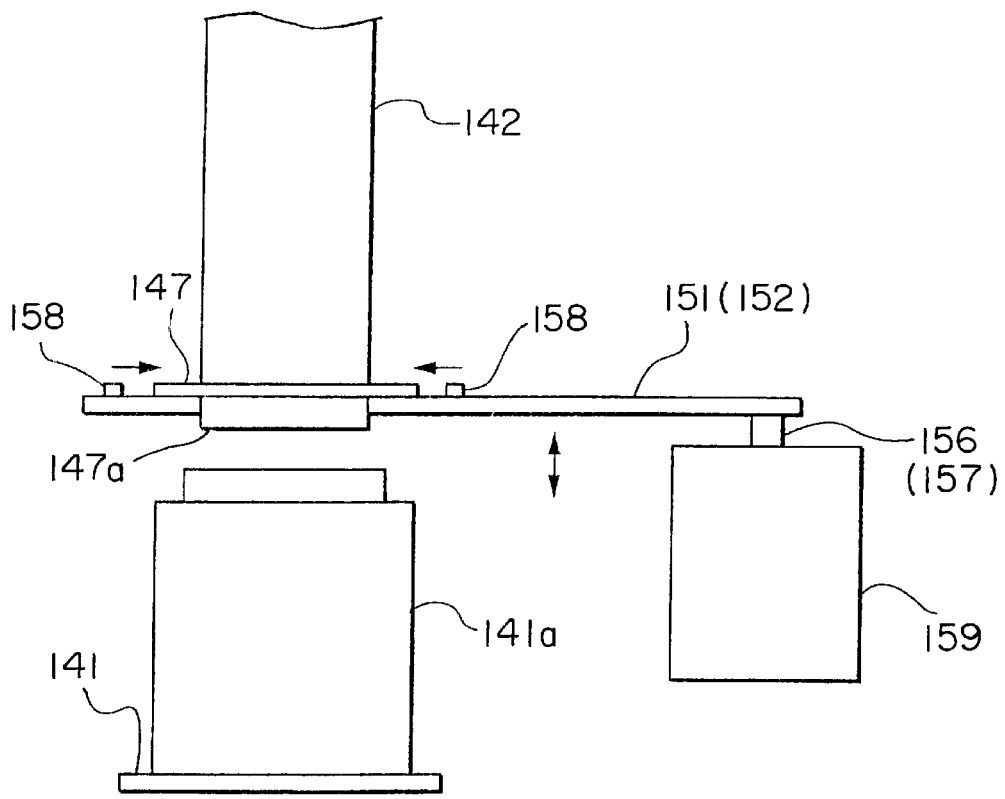
FIG. 9 is a schematic side view of the transferring mechanism in FIG. 7.
Figure 10:
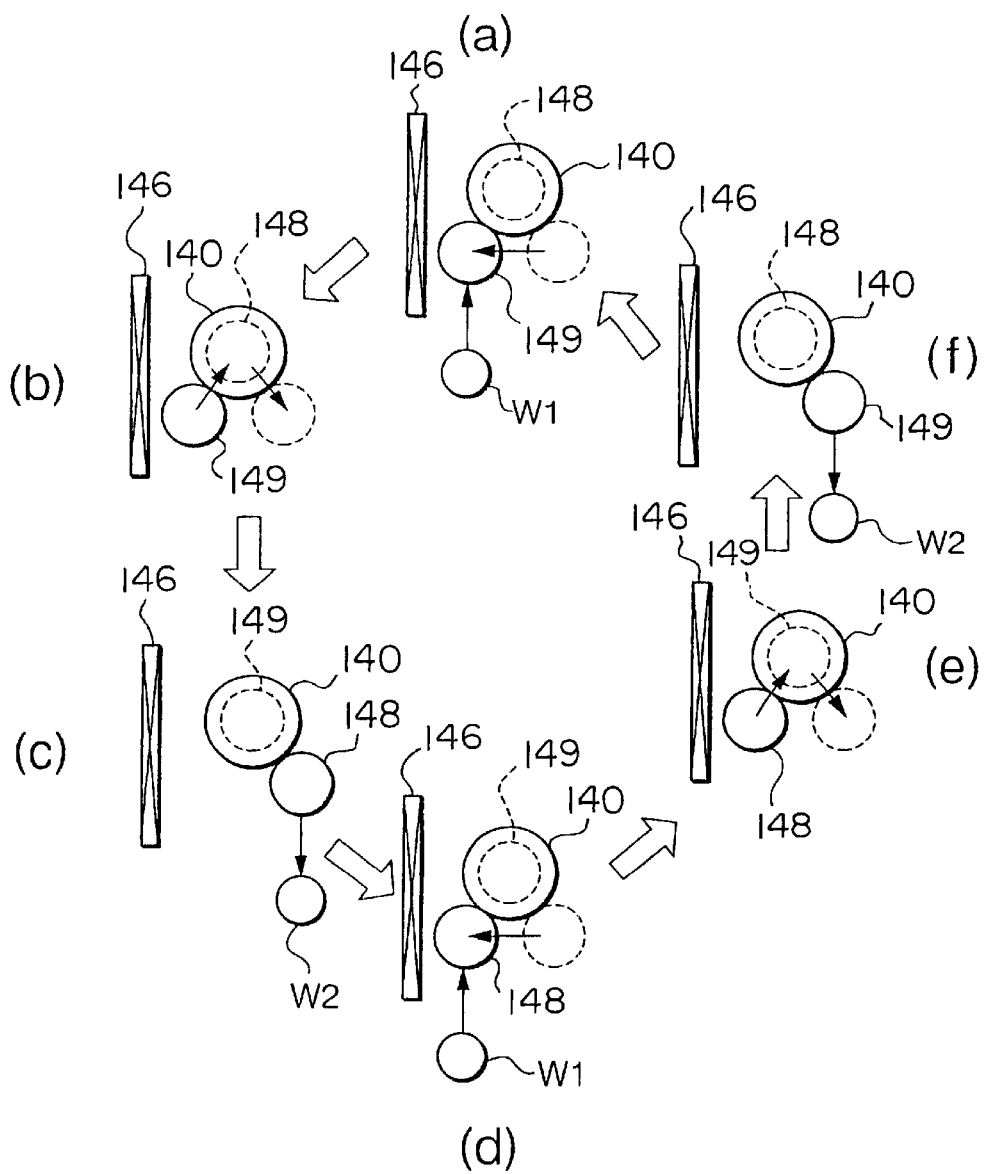
FIG. 10 is an explanatory view showing an operation of the transferring mechanism.

Each proximal end of the first pivoting arm 151 and the second pivoting arm 152 is rotatably attached at each pivoting center shaft 156 or 157. As shown in FIG. 9, a flange portion 147 is provided at the lower end portion of the wafer-boat 142. A ring-shaped protrusion 147a is provided at the lower surface of the flange portion 147 for fitting with a thermal cylinder 141a on the boat-elevator 141. Each free end of the first pivoting arm 151 and the second pivoting arm 152 has a cut-out portion for avoiding interfering with the ring-shaped protrusion 147a, and is adapted to support the lower surface of the flange portion 147.

As shown in FIG. 9, each of the first pivoting arm 151 and the second pivoting arm 152 has a clump mechanism, which consists of at least two clump members 158 adapted to laterally fasten the flange portion 147 of the wafer-boat 142 placed on the arm 151 or 152. Specifically, the clump members 158 are adapted to fasten and release the flange portion 147 of the wafer-boat 142 by means of an open-closing mechanism (not shown). The clump members 158 may also fasten and release the flange portion 147 of the wafer-boat 142 by making use of an elastic force of an elastic member such as a spring or an elastic rubber (not shown). Thus, the wafer-boat 142 is prevented from falling down while the pivoting arm 151 or 152 is pivoting. The numeral sign 159 in FIG. 9 indicates the driving means such as a motor, which drive the first pivoting arm 151 or the second pivoting arm 152 to pivot.

Figure 8:
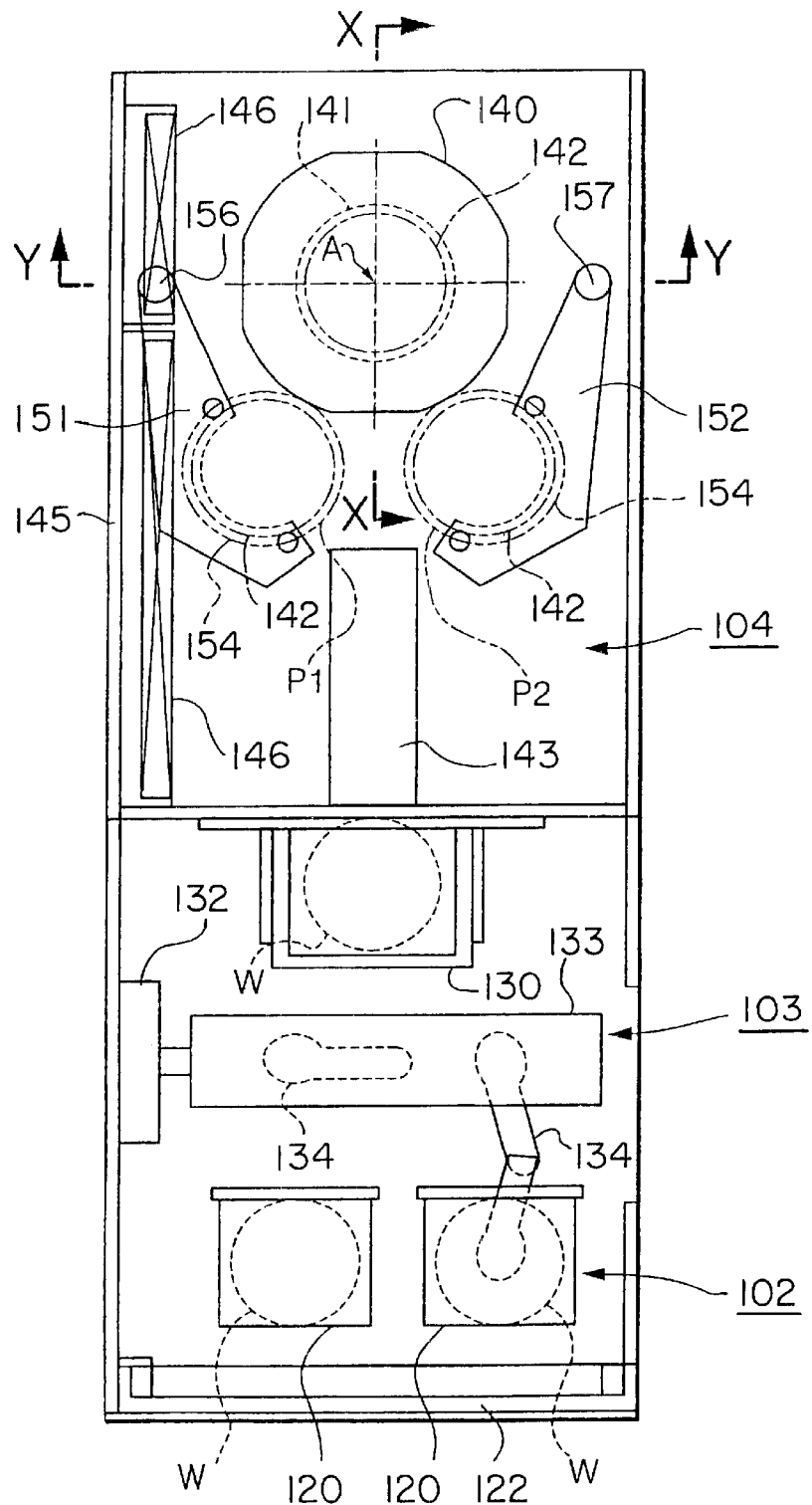
FIG. 8 is a schematic plan view of the vertical thermal processing unit in FIG. 7.

In FIG. 8, an imaginary X-axis is extending in the horizontal front-rear direction with respect to a transferring stage 102, through the center axis A of the wafer-boat 142 placed on the boat-elevator 141. An imaginary Y-axis is extending in the horizontal direction perpendicular to the X-axis. The pivoting axes 156, 157 of the first pivoting arm 151 and the second pivoting arm 152 are arranged on the Y-axis symmetrically with respect to the center axis A. Specifically, as shown in FIG. 8, the pivoting axes 156, 157 are disposed in left and right side regions of the loading area 104, respectively.

The first placing portion P1 and the second placing portion P2 of the boat-stage 154 are arranged symmetrically with respect to the X-axis, as shown as two-dot chained lines in FIG. 8. A filter unit 146 for making a clean gas flow is disposed adjacently to the lateral wall 145 near the first placing portion P1 defining the loading area 104. The clean gas flow made by the filter unit 146 is adapted to flow toward the second placing portion P2 through the first placing portion P1 in the loading area 104. The lateral wall near the second placing portion P2 defining the loading area 104 is adapted to absorb the clean gas. The pivoting arm 151 is located below the filter unit 146.

For the sake of the clean gas flow in the loading area 104, the first placing portion P1 is preferably used to load the wafer-boat into the furnace 140, and the second placing portion P2 is preferably used to unload the wafer-boat from the furnace 140. Specifically, semiconductor wafers W are transferred into the vacant wafer-boat 142 at the first placing portion P1. Then, the wafer-boat 142 is conveyed onto the boat-elevator 141 and they are conveyed into the thermal processing furnace 140 (loading). The wafer-boat 142 after the thermal processing is conveyed from the boat-elevator 141 onto the second placing portion P2. The processed semioconductor wafers W are taken out from the wafer-boat 142 at the second placing portion P2 (unloading). Thus, the semiconductor wafers W before the thermal processing are always exposed to the clean gas flow to be prevented from being contaminated by particles or the like, so that the semiconductor wafers W can be loaded into the thermal furnace 140 with the surfaces thereof kept clean. On the other hand, the wafers W after the thermal processing are unloaded from the thermal furnace 140 under the lee with respect to the clean gas flow. Thus, the wafers W after the thermal processing may be contaminated by particles or the like. However, the wafers W after the thermal processing are then conveyed to the washing step and the next processing step, so that if particles adhere to the surfaces thereof, the particles are removed in the washing step.

The above thermal processing unit operates as below. At first, a cassette 120 is placed on the transferring stage 102 from the outside by an operator or an automatic conveying robot not shown. The cassette 120 is conveyed onto the supporting stage 130 for transferring wafers by means of a cassette-transferring apparatus 103. The cassette 120 may be stored temporarily depending on the progress situation of the thermal processing.

Then, semiconductor wafers W are taken out from the cassette 120 on the supporting stage 130 by means of a wafer-transferring apparatus 143. The semiconductor wafers W are aligned by a notch aligning apparatus 144, and conveyed into the wafer-boat 142 at the first placing portion P1. The wafer-boat 142 is placed onto the boat-elevator 141 by the first pivoting arm 151, and loaded into the thermal processing furnace 140.

After the thermal processing is completed, the wafer-boat 142 is conveyed out from the thermal furnace 140, and conveyed from the boat-elevator 141 to the second placing portion P2 by the second pivoting arm 152. The processed semiconductor wafers W are taken out from the wafer-boat 142 and conveyed into the cassette 120 on the supporting stage 130 by the wafer-transferring apparatus 143. The cassette 120 filled with the processed semiconductor wafers W is conveyed to the outside through the transferring stage 102.

FIGS. 10A to 10F schematically show the moving flow of the wafer-boats. In FIGS. 7 to 9, the wafer-boats are indicated by the same numeral sign 142, but in FIGS. 10A to 10F, two wafer-boats are indicated by the different numeral signs 148 and 149, respectively. In addition, in FIGS. 10A to 10F, the numeral signs W1 and W2 indicate the wafer before the thermal processing and the wafer after the thermal processing, respectively. The first placing portion is disposed near the filter unit 146. For example, the first placing portion is shown as a position occupied by the wafer-boat 149 in FIG. 10A.

While the first wafer-boat 148 is loaded into the thermal processing furnace 140 and undergoes the thermal processing, the wafers W1 before the thermal processing are transferred into the vacant second wafer-boat 149 placed on the boat-stage 154 at the first placing portion (see FIG. 10A).

After the thermal processing of the first wafer-boat 148 is completed, the first wafer-boat 148 is unloaded, and conveyed to the second placing portion by the second pivoting arm 152. At the same time, the second wafer-boat 149 is conveyed from the first placing portion onto the boat-elevator 141 below the thermal furnace 140 by the first pivoting arm 151 (see FIG. 10B). Then, the boat stage 154 becomes empty and moves back from the first placing portion P1 to the second placing portion P2 for receiving the unloaded first wafer-boat 148 from the second pivoting arm 152.

While the second wafer-boat 149 is loaded into the thermal processing furnace 140 and undergoes the thermal processing, the. wafers W2 after the thermal processing are taken out from the first wafer-boat 148 placed on the boat-stage 154 at the second placing portion (see FIG. 10C).

After the first wafer-boat 148 becomes vacant, the boat stage 154 moves from the second placing portion P2 to the first placing portion P1 with the first wafer-boat 148 placed thereon. While the second wafer-boat 149 undergoes the thermal processing in the thermal processing furnace 140, the wafers W1 before the thermal processing are transferred into the first wafer-boat 148 placed on the boat-stage 154 at the first placing portion (see FIG. 10D).

After the thermal processing of the second wafer-boat 149 is completed, the second wafer-boat 149 is unloaded, and conveyed to the second placing portion by the second pivoting arm 152. At the same time, the first wafer-boat 148 is conveyed from the first placing portion onto the boat-elevator 141 below the thermal furnace 140 by the first pivoting arm 151 (see FIG. 10E). Then the boat stage 154 becomes empty and moves back from the first placing portion P1 to the second placing portion P2 for receiving the unloaded second wafer-boat 149 from the second pivoting arm 152.

While the first wafer-boat 148 is loaded into the thermal processing furnace 140 and undergoes the thermal processing, the wafers W2 after the thermal processing are taken out from the second wafer-boat 149 placed on the boat-stage 154 at the second lacing portion (see FIG. 10F).

After the second wafer-boat 149 becomes vacant, the boat stage 154 moves from the second placing portion P2 to the first lacing portion P1 with the second wafer-boat 149 placed thereon. Then, the cycle of FIGS. 10A to 10F is repeated.

In the above embodiment, the pivoting axes 156, 157 of the pivoting arms 151, 152 are arranged on the Y-axis symmetrically with respect to the center axis A of the wafer-boat 142 placed on the boat-elevator 141. The first placing portion P1 and the second placing portion P2 are arranged on the side of the transferring stage 102 with respect the center axis A, symmetrically with respect to the X-axis, which is perpendicular to Y-axis and passes through the center axis A. Therefore, the width of the thermal processing unit can be effectively reduced, compared with the conventional one wherein the first placing portion and the second placing portion are arranged laterally to the X-axis in one side region of the loading area 104 and only one arm transfers wafer-boats.

This invention is not limited by the above embodiments and may be modified variously within the scope of claim. For example, the substrates may be not only the semiconductor wafers but also glass substrates or LCD substrates.

What is claimed is:

1. A processing unit comprising:
    a vertical thermal processing furnace having a bottom and an opening provided at the bottom,
    a first lid on which a first boat holding substrates in vertical multistairs can be placed and which can open and close the opening of the vertical thermal processing furnace with the first boat placed thereon,
    a fixed boat-placing portion on which a second boat can be placed, and
    a boat conveying mechanism that can convey the first and second boats alternatively between the fixed boat-placing portion and the first lid.

2. A processing unit according to claim 1, further comprising:
    a second lid for hermetically closing the opening of the vertical thermal processing furnace after the first lid has opened the opening and the furnace is empty of any boat,
    wherein the second lid is a shutter which can be moved vertically and horizontally with respect to an outside surface of the opening of the vertical thermal processing furnace to open and close the opening.

3. A processing unit according to claim 2, further comprising:

a notch aligning mechanism arranged along a vertical central line of the carrier-placing portion for aligning notches provided at the substrates.

4. A processing unit according to claim 1, further comprising:

a carrier-placing portion on which a carrier housing the substrates can be placed, and a transferring mechanism for transferring the substrates between the carrier placed on the carrier-placing portion and the second boat when the second boat is placed on the fixed boat-placing portion.

5. A processing unit according to claim 4, wherein:

the transferring mechanism is retractable in such a manner that the transferring mechanism does not interfere with a boat conveyed by the boat conveying mechanism.

6. A processing unit according to claim 4, further comprising:

a notch aligning mechanism arranged along a vertical central line of the carrier-placing portion for aligning notches provided at the substrates.

7. A processing unit according to claim 1, wherein:

the boat conveying mechanism includes:

a first arm which has a rotational axis and a distal end and which can be vertically elevated and horizontally rotated around the rotational axis, and a second arm which is supported at the distal end in such a manner that the second arm can horizontally rotate around the distal end and which can vertically hold a boat and convey the boat held in such a manner that a center of the held boat passes over the rotational axis of the first arm, and the boat conveying mechanism can convey the held boat in a radial direction with respect to the rotational axis of the first arm by synchronously rotating the first arm and the second arm.

8. A processing unit according to claim 7, wherein:

the transference mechanism is movable vertically above the boat conveying mechanism.

9. A processing unit according to claim 1, further comprising:

a ventilating unit disposed adjacent the fixed boat-placing portion for making a clean gas flow.

10. A processing unit according to claim 9, wherein:

the fixed boat-placing portion has a first placing portion and a second placing portion arranged between the first placing portion and the first lid, and the boat conveying mechanism is operable to convey a boat at the first placing portion to the second placing portion, a boat from the second placing portion to the first lid, and a boat from the first lid to the first placing portion in such a manner that the boat conveyed from the first lid to the first placing portion passes under the second placing portion with respect to the clean gas flow made by the ventilating unit.

11. A processing unit according to claim 1, wherein:

the boat conveying mechanism includes:

a first arm which has a rotational axis and a distal end and which can be vertically elevated and horizontally rotated around the rotational axis, and a second arm which is supported at the distal end in such a manner that the second arm can horizontally rotate around the distal end and which can vertically hold a boat and convey the boat held in such a manner that a center of the held boat passes over the rotational axis of the first arm, and the boat conveying mechanism can convey the held boat in a radial direction with respect to the rotational axis of the first arm by synchronously rotating the first arm and the second arm.

12. A processing unit according to claim 11, wherein:

the transference mechanism is movable vertically above the boat conveying mechanism.

13. A processing unit comprising:

a vertical thermal processing furnace having a bottom and an opening provided at the bottom, a first lid on which a first boat holding substrates in vertical multistairs can be placed and which can open and close the opening of the vertical thermal processing furnace with the first boat placed thereon, a fixed boat-placing portion on which a second boat can be placed, and a boat conveying mechanism that can convey the first and second boats alternatively between the fixed boat-placing portion and the first lid, wherein the fixed boat-placing portion has a first placing portion and a second placing portion arranged between the first placing portion and the first lid.

14. A processing unit according to claim 13, further comprising:

a second lid for hermetically closing the opening of the vertical thermal processing furnace after the first lid has opened the opening and the furnace is empty of any boat, wherein the second lid is a shutter which can be moved vertically and horizontally with respect to an outside surface of the opening of the vertical thermal processing furnace to open and close the opening.

15. A processing unit according to claim 13, further comprising:

a carrier-placing portion on which a carrier housing the substrates can be placed, and a transferring mechanism for transferring the substrates between the carrier placed on the carrier-placing portion and the second boat when the second boat is placed on the fixed boat-placing portion.

16. A processing unit according to claim 15, wherein:

the transferring mechanism is retractable in such a manner that the transferring mechanism does not interfere with a boat conveyed by the boat conveying mechanism.

17. A processing unit according to claim 13, further comprising:

a ventilating unit disposed adjacent the fixed boat-placing portion for making a clean gas flow.

18. A processing unit according to claim 17, wherein:

the boat conveying mechanism is operable to convey a boat at the first placing portion to the second placing portion, a boat from the second placing portion to the first lid, and a boat from the first lid to the first placing portion in such a manner that the boat conveyed from the first lid to the first placing portion passes under the second placing portion with respect to the clean gas flow made by the ventilating unit.

* * * * *